(12) United States Patent
Yao

(10) Patent No.: US 8,314,446 B2
(45) Date of Patent: Nov. 20, 2012

(54) PHOTO-DETECTOR ARRAY, SEMICONDUCTOR IMAGE INTENSIFIER AND METHODS OF MAKING AND USING THE SAME

(75) Inventor: Jie Yao, Princeton, NJ (US)

(73) Assignee: Wavefront Holdings, LLC, Basking Ridge, NJ (US)

( * ) Notice: Subject to any disclaimer, the term of this patent is extended or adjusted under 35 U.S.C. 154(b) by 322 days.

(21) Appl. No.: 12/244,938

(22) Filed: Oct. 3, 2008

(65) Prior Publication Data
US 2009/0101919 A1 Apr. 23, 2009

Related U.S. Application Data

(60) Provisional application No. 60/979,179, filed on Oct. 11, 2007.

(51) Int. Cl.
*H01L 31/147* (2006.01)
*H01L 31/103* (2006.01)
*H01L 31/11* (2006.01)

(52) U.S. Cl. ......... 257/184; 257/85; 257/461; 257/187; 257/E31.057; 257/E31.069; 257/E31.101

(58) Field of Classification Search .................... 257/184
See application file for complete search history.

(56) References Cited

U.S. PATENT DOCUMENTS

| | | | |
|---|---|---|---|
| 4,740,687 A | 4/1988 | Kiyohara | |
| 5,229,623 A * | 7/1993 | Tanoue et al. | 257/25 |
| 5,283,447 A * | 2/1994 | Olbright et al. | 257/85 |
| 5,552,837 A | 9/1996 | Mankovitz | |
| 5,851,849 A | 12/1998 | Comizzoli et al. | |
| 5,892,575 A | 4/1999 | Marino | |
| 6,515,740 B2 | 2/2003 | Bamji et al. | |
| 6,544,906 B2 | 4/2003 | Rotondaro et al. | |
| 6,580,496 B2 | 6/2003 | Bamji et al. | |
| 6,640,956 B1 * | 11/2003 | Zwieg et al. | 194/328 |
| 6,770,536 B2 | 8/2004 | Wilk et al. | |
| 7,045,847 B2 | 5/2006 | Lin et al. | |
| 7,067,853 B1 * | 6/2006 | Yao | 257/184 |

(Continued)

FOREIGN PATENT DOCUMENTS

WO WO 0249339 6/2002

OTHER PUBLICATIONS

H. Shao, W. Li, A. Torfi, D. Moscicka, W. I. Wang, Room-Temperature p-n-p AlGaAsSb-InGaAsSb Heterojunction Phototransistors With Cutoff Wavelength at 2.5 um, IEEE Photonics Technology Letters, vol. 18, No. 22, pp. 2326-2328, Nov. 15, 2006.

(Continued)

*Primary Examiner* — Jarrett Stark
*Assistant Examiner* — Lawrence Tynes, Jr.
(74) *Attorney, Agent, or Firm* — Pillsbury Winthrop Shaw Pittman LLP

(57) ABSTRACT

A sensor including an array of light sensitive pixels, each pixel including: at least one hetero-junction phototransistor having a floating base without contact, wherein each phototransistor is a mesa device having active layers exposed at side-walls of the mesa device; and at least one atomic layer deposited high-k dielectric material adjacent to and passivating at least the side-wall exposed active layers.

23 Claims, 10 Drawing Sheets

U.S. PATENT DOCUMENTS

| | | |
|---|---|---|
| 7,160,577 B2 | 1/2007 | Ahn et al. |
| 7,180,103 B2 | 2/2007 | Bude et al. |
| 7,192,892 B2 | 3/2007 | Ahn et al. |
| 7,262,402 B2 | 8/2007 | Niclass et al. |
| 2003/0087486 A1* | 5/2003 | Laurin et al. ............ 438/200 |
| 2007/0128779 A1* | 6/2007 | Oh et al. ............ 438/158 |
| 2008/0111175 A1* | 5/2008 | Cheng et al. ............ 257/302 |

OTHER PUBLICATIONS

M. L. Huang, Y. C. Chang, C. H. Chang, Y. J. Lee, P. Chang, J. Kwo, T. B. Wu, M. Hong, "Surface Passivation of III-V Compound Semiconductors Using Atomic-Layer-Deposition-Grown Al2O3", Applied Physics Letters, vol. 87, 252104, 2005.

A. Biber, P. Seitz, H. Jackel, Avalanche photodiode image sensor in standard BiCMOS technology, IEEE Transactions on Electron Devices, vol. 47, No. 11, pp. 2241-2243, Nov. 2000.

A. Rochas, A. R. Pauchard, P. A. Besse, D. Pantic, Z. Prijic, R. S. Popovic, Low-noise silicon avalanche photodiodes fabricated in conventional CMOS technologies, IEEE Transactions on Electron Devices, vol. 49, No. 3, pp. 387-394, Mar. 2002.

G. F. Marshall, J. C. Jackson, J. Denton, P. K. Hurley, O. Braddell, A. Mathewson, Avalanche photodiode-based active pixel imager, IEEE Transactions on Electron Devices, vol. 51, No. 3, pp. 509-511, Mar. 2004.

S. Nilsson, T. Kjellberg, T. Klinga, J. Wallin, K. Streubel, R. Schatz, DFB laser with nonuniform coupling coefficient realized by double-layer buried grating, IEEE Photonics Technology Letters, vol. 5, No. 10, pp. 1128-1131, Oct. 1993.

R.J. Cater et al., "Passivation and interface state density of $SiO_2$/$HfO_2$-based/polycrystalline-Si gate stacks", Applied Physics Letter, vol. 83, No. 3, (Jul. 21, 2003).

* cited by examiner

US 8,314,446 B2

PHOTO-DETECTOR ARRAY, SEMICONDUCTOR IMAGE INTENSIFIER AND METHODS OF MAKING AND USING THE SAME

CROSS-REFERENCE TO RELATED APPLICATIONS

This application claims priority of U.S. Provisional Patent Application No. 60/979,179, filed Oct. 11, 2007, entitled "ALD $AL_2O_3$ & CASCODE & FLASH LIDAR & DFB LASER", the entire disclosure of which is hereby incorporated by reference as if being set forth in its entirety herein.

STATEMENT REGARDING FEDERALLY SPONSORED RESEARCH OR DEVELOPMENT

This invention was made in part with government support under SBIR Phase II grant contract number W911QX-08-C-0075. The U.S. Government may have certain rights in this invention.

FIELD OF THE INVENTION

Embodiments of the present invention relate generally to photo-detectors, photodetector arrays and image intensifiers, and methods of making and using the same.

BACKGROUND OF THE INVENTION

Photodetectors, photodetector arrays and image intensifiers find a wide range of applications. By way of non-limiting example, high photon detection sensitivity facilitates night vision, long range flash light detection and ranging (LIDAR) and many other applications, while high resolution large format focal plane arrays are desirable for high-definition imaging. High resolutions generally require improved sensitivity, since each imaging pixel receives less light as the pixel count increases.

Reference is made to U.S. Pat. No. 7,067,853, issued Jun. 27, 2006, entitled IMAGE INTENSIFIER USING HIGH-SENSITIVITY HIGH-RESOLUTION PHOTODETECTOR ARRAY, in which the inventor of the subject application proposes achieving higher sensitivity through higher amplification gain than avalanche photodiodes (APDS) not operating in a Geiger mode. Nonetheless, it is now believed to be useful to further improve gain, reduce dark current and dark current noise, and to improve device uniformity, reliability and manufacturing yields.

SUMMARY OF THE INVENTION

An opto-electronic device including: at least one p-n or p-i-n junction as part of a mesa device having active layers exposed at surrounding side-walls of the mesa device; and at least one atomic layer deposited high-k dielectric material adjacent to (such as in direct physical contact with) and passivating at least the side-wall exposed active layers.

A sensor including an array of light sensitive pixels, each pixel including: at least one hetero-junction phototransistor having a floating base without contact, wherein each phototransistor is a mesa device having active layers exposed at side-walls of the mesa device; and at least one atomic layer deposited high-k dielectric material adjacent to and passivating at least the side-wall exposed active layers.

BRIEF DESCRIPTION OF THE DRAWINGS

Understanding of the present invention will be facilitated by consideration of the following detailed description of the preferred embodiments of the present invention taken in conjunction with the accompanying drawings, in which like numerals refer to like parts.

DETAILED DESCRIPTION OF THE PREFERRED EMBODIMENTS

Figure 1:
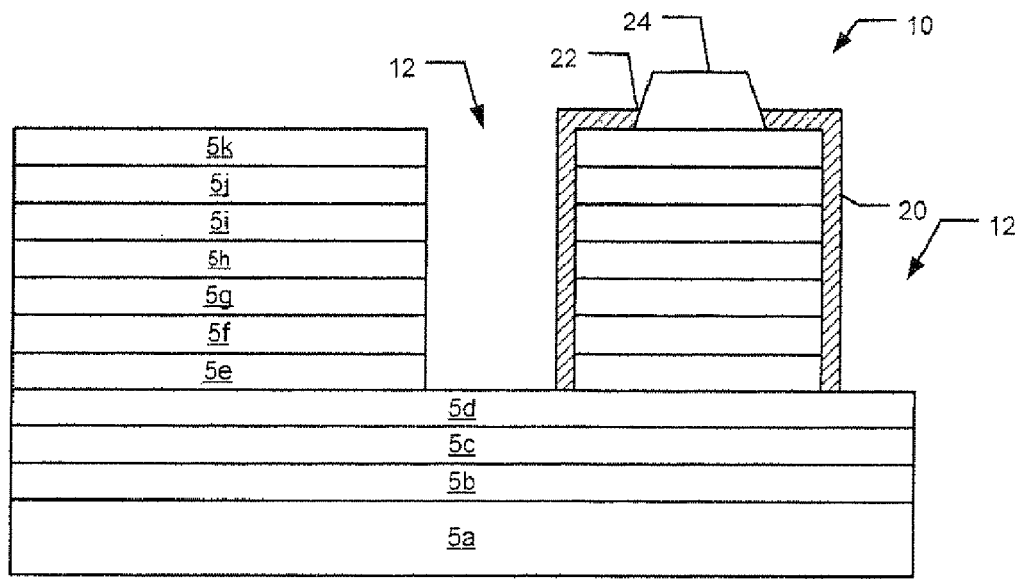
FIG. 1 illustrates a GaAs/InGaP-based hetero-junction phototransistor (HPT) pixel according to an embodiment of the present invention.

It is to be understood that the figures and descriptions of embodiments of the present invention have been simplified to illustrate elements that are relevant for a clear understanding of the present invention, while eliminating, for the purpose of clarity, many other elements found in typical photodetectors and image intensifiers. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

In order to maintain a high heterojunction phototransistor (HPT) amplification gain, high sensitivity, low dark current and low dark current noise, it is now proposed to improve surface passivation relative to that discussed in the aforementioned U.S. Pat. No. 7,067,853. It should be appreciated that the structure and physical parameters of a dielectric passivation film may vary by orders of magnitude depending on the method, and sometimes even the condition, of film growth. Embodiments of the present invention address passivation in two aspects—material and growth, as the quality of the resulting passivation depends not only on the choice of the passivating dielectric material but also on the formation or thin film growth method used to create the passivating film.

By way of non-limiting example, a wide range of dielectric materials have been historically experimented with, including polyimide, benzocyclobutene (BCB), amorphous silicon (a-Si), silicon oxide ($SiO_2$), silicon nitride ($Si_3N_4$), titanium oxide ($TiO_2$), magnesium oxide (MgO), aluminum oxide ($Al_2O_3$), aluminum nitride (AlN), gallium nitride (GaN), cadmium sulfide (CdS), spin-on glass, regrown indium phosphide (InP), regrown gallium arsenide (GaAs), regrown silicon (Si), germanium (Ge), zinc selenide (ZnSe), tantalum oxide ($Ta_2O_5$), yttrium stabilized zirconia (YSZ), and self-assembled organic nanodielectrics (SANDs), to name a few.

Similarly, a wide variety of formation techniques, such as growth and deposition, have also been experimented with, including but not limited to: wet thermal oxidation, dry thermal oxidation, ozone oxidation, anodizing, chemical solution deposition (CSD), organometallic chemical vapor deposition (MOCVD) regrowth, metalorganic vapour phase epitaxy (MOVPE) regrowth, liquid phase epitaxy (LPE) regrowth, plasma enhanced chemical vapor deposition (PECVD), reactive sputtering, plasma electrolytic oxidation (PEO), micro-arc oxidation (MAO), electrostatic spray assisted vapour deposition (ESAVD), plasma electrolytic oxidation, spin-on dielectric, electron beam physical vapor deposition (EB-PVD), thermal physical evaporation, molecular beam epitaxy (MBE) regrowth, laser-assisted electron beam deposition, argon sputtering, ion beam assisted deposition (IBAD), pulsed laser deposition, cathodic arc deposition or Arc-PVD, ion beam deposition, magnetron sputtering, aerosol jet deposition.

Silicon oxide grown by dry thermal oxidation of silicon on a silicon substrate, and silicon nitride deposited by PECVD (plasma enhanced chemical vapor deposition) on a III-V semiconductor substrate under stringent conditions have certain uses. However, a reproducible, reliable and manufacturable method of semiconductor surface passivation for most semiconductor materials has largely been elusive. As may be appreciated, the number of possible combinations of dielectric materials, their growth methods and growth conditions (e.g., surface pre-treatments, temperature, pressure, time, plasma power, flow rates, post-deposition annealing conditions, again including temperature, pressure, time, flow rates), is prohibitively large, making a comprehensive and exhaustive study practically impossible.

Embodiments of the present invention utilize high-k dielectric materials (i.e., solid state thin-film dielectric materials having a higher dielectric constant than silicon oxide created by the dry thermal oxidation of silicon), conventionally reserved for use as a field effect transistor (FET) gate dielectric material, to provide photo-detector array surface passivation. Embodiments of the present invention utilize such high-k dielectric materials to provide photo-detector array mesa sidewall surface passivation. Some high-k dielectric materials suitable for use according to embodiments of the present invention include, by way of non-limiting example, hafnium silicon oxynitride ($HfSiO_xN_y$) and aluminum oxide ($Al_2O_3$).

By way of non-limiting explanation, high-k dielectric materials have been deposited by Atomic Layer Deposition (ALD) to provide a gate dielectric of a silicon CMOS (Complementary Metal Oxide Semiconductor) MOSFET (Metal Oxide Semiconductor Field Effect Transistor). While such a MOSFET is a planar, electronic voltage-controlled 3-terminal device, embodiments of the present invention propose using ALD formed high-k dielectric materials to provide surface passivation of a mesa opto-electronic photo-current-controlled 2-terminal bipolar photo-transistor (BJT) device and/or hetero-junction phototransistor (HPT) device.

First, it should be understood that a MOSFET is typically used as an electronic device with no opto-electronic function, whereas an HPT may be used as a photodetector that responds to an optical input. Second, it should also be understood that a MOSFET is a 3-terminal device with an electrical gate input voltage, whereas an HPT is a 2-terminal device with a floating base, and no electrical input or electrical control terminal. An HPT is instead controlled by an optical input. Third, it should further be understood that a MOSFET is a voltage-controlled device with its transistor action controlled by its gate voltage. Gate leakage input current is detrimental and minimized, resulting in high input impedance. In contrast, an HPT is a photo-current-controlled bipolar device with its transistor action controlled by its base photo-current. Emitter junction bias voltage is minimized, resulting in low input impedance for its internal photo-current, which is generated by the input optical signal. Fourth, it should also be understood that a MOSFET is a planar device typically fabricated on the (100) surface of silicon, where the interface between silicon and silicon oxide has the highest quality. In contrast, an HPT mesa has facets in different crystallographic planes surrounding the mesa structure, as well as the intersection between sidewall facets with much higher Miller indices. Fifth, it should yet further be understood that a MOSFET is a majority carrier device, whereas the HPT is a minority carrier device. Sixth, it should yet also be understood that while an ALD formed high-k gate dielectric layer in a MOSFET is one of the electrically active critical structures directly responsible for the MOSFET transconductance gain, an ALD formed high-k dielectric mesa sidewall passivation layer only serves to maintain the bulk functionality of the opto-electronically active semiconductor layers and is not directly responsible for the HPT photo-current gain. Seventh, it should be understood as well that the in the MOSFET, the high-k dielectric is always in direct physical contact with the gate electrode, while in the mesa HPT, the high-k dielectric mesa sidewall surface passivation layer is physically separated from any electrode. In summary, it should be appreciated that a MOSFET and HPT are very different in structure, physics and functionality. Analogously, it should be appreciated that one interested in improving image intensifiers and photo-detector arrays would not have conventionally turned to ALD processing because ALD is a processing technique conventionally used with non-photonic, MOSFET devices, which substantially differ in form and operation from HPTs.

By way of further explanation, it may be noted U.S. Pat. No. 5,851,849, entitled PROCESS FOR PASSIVATING SEMICONDUCTOR LASER STRUCTURES WITH SEVERE STEPS IN SURFACE TOPOGRAPHY, proposes using ALD $Al_2O_3$ on top of other dielectric material to passivate an optical output facet of a semiconductor buried hetero-structure laser, and protect against facet degradation in non-hermetically sealed packages. It should be appreciated that such an approach is not only quite different, but largely opposite from embodiments of the present invention. First, a laser emits light, whereas an HPT detects light. Second, a laser optical gain media amplifies light without electrical amplification, while an HPT absorbs light and electrically amplifies the photoelectrons. Third, the buried hetero-structure laser disclosed in U.S. Pat. No. 5,851,849 has neither a mesa structure nor opto-electronically active layers nor p-n junctions exposed at mesa sidewalls, whereas embodiments of the present invention have an HPT having active layers exposed to its surrounding mesa sidewalls until passivated with ALD formed high-k dielectric materials. Fourth, according to U.S. Pat. No. 5,851,849, yttrium stabilized zirconia (YSZ) deposited with unspecified technique is the only material in direct physical contact with the exposed laser output facet, and ALD $Al_2O_3$ further covers YSZ to provide environmental protection, while this patent teaches the use of ALD $Al_2O_3$ in direct physical contract with the exposed detector active layers. Fifth, while U.S. Pat. No. 5,851,849 claims to achieve "excellent environmental stability" and "protection against air born contaminant induced degradation" for semiconductor lasers in their non-hermetically sealed packages, embodiments of the present invention are instead directed to passivating the HPT semiconductor device at the mesa surface itself prior to packaging. Sixth, embodiments of the present invention propose to cover an ALD formed $Al_2O_3$ mesa surface passivating layer with other environmentally more stable dielectric materials—exactly the opposite of U.S. Pat. No. 5,851,849. In summary, embodiments of the present invention propose HPT mesa sidewall passivation with a second different dielectric material, such as silicon nitride, silicon oxide, polyimide, BCB, epoxy, and/or light absorbing polymers suitable for image intensifier configurations, to protect against environmental degradation.

In order to facilitate efficient electronic readout of HPT-based photodetector arrays via conventional CMOS active pixel sensor (APS) readout circuit, a photo-cascode pixel may be advantageously utilized to greatly enhance the output impedance in certain embodiments of the present invention. Such an approach is proposed in U.S. Pat. No. 4,740,687, entitled LIGHT PULSE DETECTING DEVICE WITH IMPROVED RESPONSE CHARACTERISTIC UTILIZING CASCODE-CONNECTED LIGHT SENSITIVE DEVICE, the entire disclosure of which is hereby incorporated by reference as if being set forth in its entirety herein. Embodiments of the present invention exhibit a monolithic and vertical integration of such a photo-cascode. An epitaxial structure and fabrication method of such a monolithically and vertically integrated photo-cascode may be used. Such an integration may advantageously simplify device fabrication, maximize imaging fill factor, reduce pixel size, increase resolution and/or reduce array size, weight and cost.

Flash LIDAR applications typically have stringent resolution and sensitivity requirements. Embodiments of the present invention may provide an HPT-based photodetector array and/or semiconductor image intensifier well suited for flash LIDAR applications. According to certain embodiments of the present invention, and instead of modulating photodetection quantum efficiency, as proposed in U.S. Pat. No. 6,515,740, entitled METHODS FOR CMOS-COMPATIBLE THREE-DIMENSIONAL IMAGE SENSING USING QUANTUM EFFICIENCY MODULATION, electrical amplification gain of the constituent HPT or photo-Darlington in each pixel according to an embodiment of the present invention may be modulated via its bias voltage. Such a modulation may be at substantially same frequency as a modulated light source used to excite the detector array. In such a mode, substantially no photo-detection quantum efficiency is apparently or significantly modulated.

Referring now to FIG. 1, there is shown an HPT mesa device 10. Mesa device 10 is defined in the illustrated embodiment by etched isolation trench 12. In the illustrated embodiment, mesa device 10 is at least substantially uniformly deposited with a conformal coating 20 of a high-k material, such as $Al_2O_3$ (aluminum oxide), $ZrSiO_xN_y$ (zirconium silicon oxynitride) or $HfSiO_xN_y$ (hafnium silicon oxynitride). In certain embodiments of the present invention, such a layer may have a thickness about 2000 Angstroms, or less. In certain embodiments of the present invention, such a layer may have a thickness of about 1,000 Angstroms or less. In certain embodiments of the present invention, such a layer may be formed using atomic layer deposition (ALD). In certain embodiments of the present invention such a layer may be deposited using trimethyl aluminum and water as precursors, in a nitrogen carrier gas at 300 degrees Celsius in a near vacuum condition, with post deposition annealing at around 400-600 degrees Celsius for seconds to minutes. It is believed, that notwithstanding there are many different possible combinations of material and processing techniques and processing conditions, ALD formed high-k material coatings are uniquely well suited for HPT mesa surface passivation.

By way of non-limiting explanation, a passivating layer is a layer that achieves the passivation of the surface of its underlying structure. According to this invention, surface passivation minimizes the generation and recombination of charged carriers (e.g., electrons and holes) due to surface traps on mesa sidewalls, minimizes semiconductor surface effects, and renders the semiconductor surface opto-electronic properties to resemble the corresponding semiconductor bulk properties. By way of further non-limiting explanation, ALD is generally a gas phase chemical process suitable for forming extremely thin coatings at atomic precision. ALD reactions generally use two or more chemical precursors. These precursors generally react with the deposition targeted surface individually and in a sequential manner. By alternating and exposing the precursors to the growth surface repeatedly, a thin film is deposited. In certain embodiments of the present invention, openings 22 at the top of the HPT mesa device 10 may be etched, and an Ohmic output current metal contact 24 to the mesa HPT device 10 provided there through. In certain embodiments of the present invention, a self-aligned photolithography process may be used.

Figure 2:
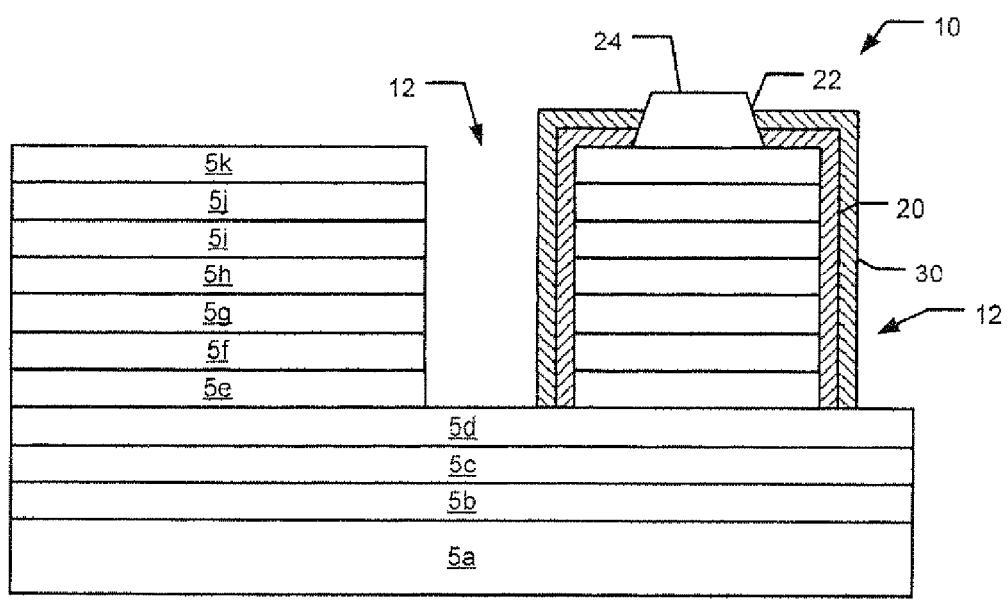
FIG. 2 illustrates a GaAs/InGaP-based hetero-junction phototransistor (HPT) pixel according to an embodiment of the present invention.

Referring now to FIG. 2, like references identify like elements of the invention, such that a further discussion of these elements is not presented, Nonetheless, it should be understood that notwithstanding the contrary teachings of U.S. Pat. No. 5,851,849, in certain embodiments of the present invention the ALD dielectric layer is further covered by another dielectric material 30 with a higher environmental resistance, such as silicon oxide, silicon nitride, silicon oxynitride, polyimide, benzocyclobutene (BCB) or a suitable epoxy, both by way of non-limiting example only.

Referring now to FIGS. 1 and 2, the illustrated HPT mesa device 10 is formed from layered material system 5. In the illustrated embodiment, and by way of non-limiting example only, material system 5 may take the form of a semiconductor-based material system, such as a GaAs, InP, GaN and/or SiGeC-based material system.

In the illustrated embodiments, system 5 includes a GaAs substrate 5a. In the illustrated embodiments, system 5 includes a GaAs buffer layer 5b disposed over substrate 5a. In the illustrated embodiments, system 5 includes an InGaP etch stop layer 5c disposed over buffer layer 5b. In the illustrated embodiments, system 5 includes a GaAs sub-collector layer 5d disposed over etch stop layer 5c. In the illustrated embodiments, system 5 includes GaAs collector layer 5e over sub-collector layer 5d. In the illustrated embodiments, system 5 includes a GaAs absorber layer 5f that may serve as a collector junction and be disposed over collector layer 5e. In the illustrated embodiments, system 5 includes a GaAs base layer 5g disposed over absorber layer 5f. In the illustrated embodiments, system 5 includes a GaAs base layer 5h that serves as a low-bandgap portion of the emitter hetero-junction and is disposed over base layer 5g. In the illustrated embodiments, system 5 includes an InGaP emitter layer 5i that serves as a high-bandgap portion of the emitter heterojunction and is disposed over base layer 5h. In the illustrated embodiments, system 5 includes an InGaP emitter layer 5j disposed over emitter layer 5i. In the illustrated embodiments, system 5 includes a GaAs cap layer 5k disposed over emitter layer 5j.

In the illustrated embodiments of FIGS. 1 and 2, trench 12 extends around mesa device 10 and through cap layer 5k, emitter layer 5j, emitter junction layers 5i, 5h, base layer 5g, absorber layer 5f and collector layer 5e, to define mesa device 10. In the illustrated embodiments of FIGS. 1 and 2, mesa surfaces of cap layer 5k, emitter layer 5j, emitter junction layers 5i, 5h, base layer 5g, absorber layer 5f and collector layer 5e are exposed by trench 12. In the illustrated embodiments of FIGS. 1 and 2, the exposed surface layers are passivated using and ALD formed high-k coating 20.

In the illustrated embodiment of FIG. 2, high-k coating 20 is environmentally protected using material 30. Material 30 may take the form of a single or multi-layer structure. Material 30 may include organic and/or inorganic materials. In certain embodiments of the present invention, material 30 may be a substantially conformal or planarizing layer. Material 30 may be deposited using any of a variety of methods. Planarizing coatings can be achieved using, for example, spin-on organic dielectrics heated above the glass transition temperatures, while more conformal coatings can be, for example, silicon oxynitride deposited by plasma enhanced chemical vapor deposition (PECVD) technique.

Referring still to FIGS. 1 and 2, in operation light provided at substrate 5a may induce an output current at contact 24. Contact 24 may be electrically connected either with an LED array or with an electronic readout circuit to provide an indication of light impinging a mesa device 10 corresponding portion (e.g., vertically aligned portion) of substrate 5a. Multiple such mesa devices 10 may be defined by analogous trenches, to provide a one- or two-dimensional array of sensors.

Figure 3A:
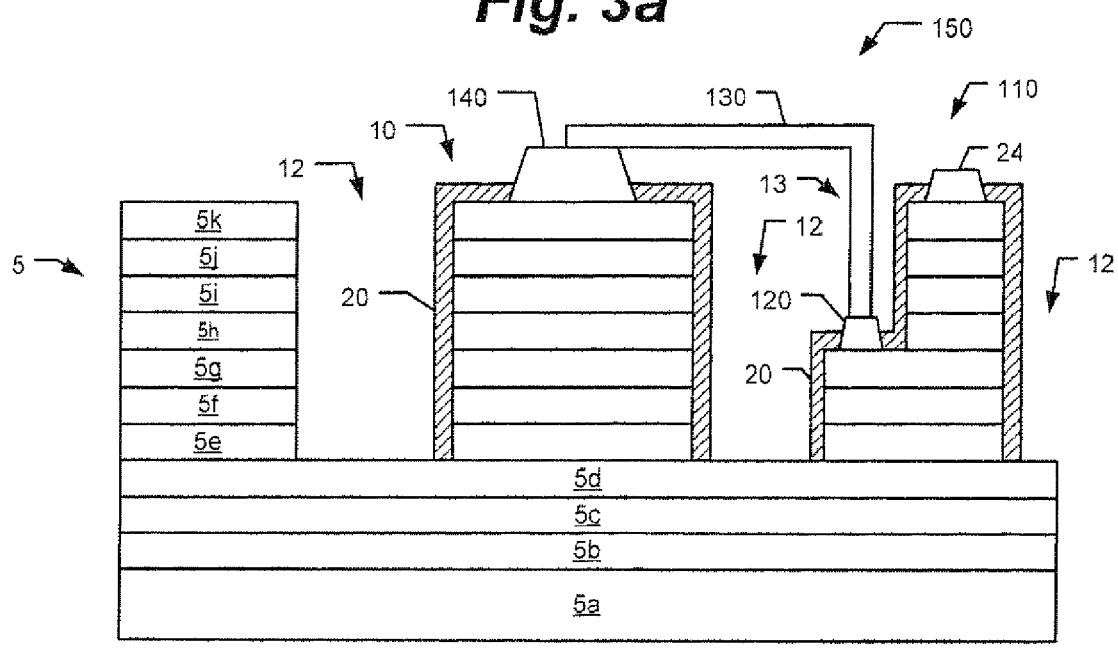
FIG. 3a illustrates a monolithically integrated GaAs/InGaP-based hetero-junction phototransistor (HPT) and hetero-junction bipolar transistor (HBT) photo-Darlington pixel according to an embodiment of the present invention.

Referring now to FIG. 3a, there is shown a photo-Darlington pixel utilizing the HPT mesa device 10 of FIG. 1 according to an embodiment of the present invention. "Photo-Darlington", as used herein, generally refers to a light sensitive Darlington amplifier, where one of the transistors (e.g., the first transistor) is a phototransistor. Like elements are designated using like references, and will not be again described. In the embodiment of FIG. 3a, a hetero-junction bipolar transistor (HBT) 110 is also provided. HBT mesa device 110 and HPT mesa device 10 are monolithically integrated with one-another in common material system 5. A base contact 120 for HBT 110 and a metal interconnect 130 between the HPT emitter contact 140 and the HBT base contact 120 are provided, to provide a monolithically integrated HPT-HBT photo-Darlington 150.

In the illustrated embodiment of FIG. 3a, trench 12 still extends through cap layer 5k, emitter layer 5j, emitter junction layers 5i, 5h, base layer 5g, absorber layer 5f and collector layer 5e, to form mesa HBT device 110. In the illustrated embodiment of FIG. 3a, trench 12 includes a shallower portion or recess 13. In the illustrated embodiment of FIG. 3a, recess 13 extends through cap layer 5k, emitter layer 5j, emitter junction layers 5i, 5h, to expose a portion of base layer 5g. Contact 120 is provided on the recess 13 exposed portion of base layer 5g, analogously as contact 24 is provided on cap layer 5k. In the illustrated embodiment of FIG. 3a, mesa sidewall surfaces of cap layer 5k, emitter layer 5j, emitter junction layers 5i, 5h, base layer 5g, absorber layer 5f and collector layer 5e are exposed by trench 12. In the illustrated embodiment of FIG. 3a, the exposed mesa surface layers are passivated using ALD formed high-k coating 20.

In the illustrated embodiment of FIG. 3a, both the HPT and HBT may have mesa sidewalls, or surfaces, passivated by Atomic Layer Deposition of $Al_xO_y$, (e.g., aluminum oxide, stoichiometric $Al_2O_3$ or non-stoichiometric $Al_xO_y$).

Figure 4A:
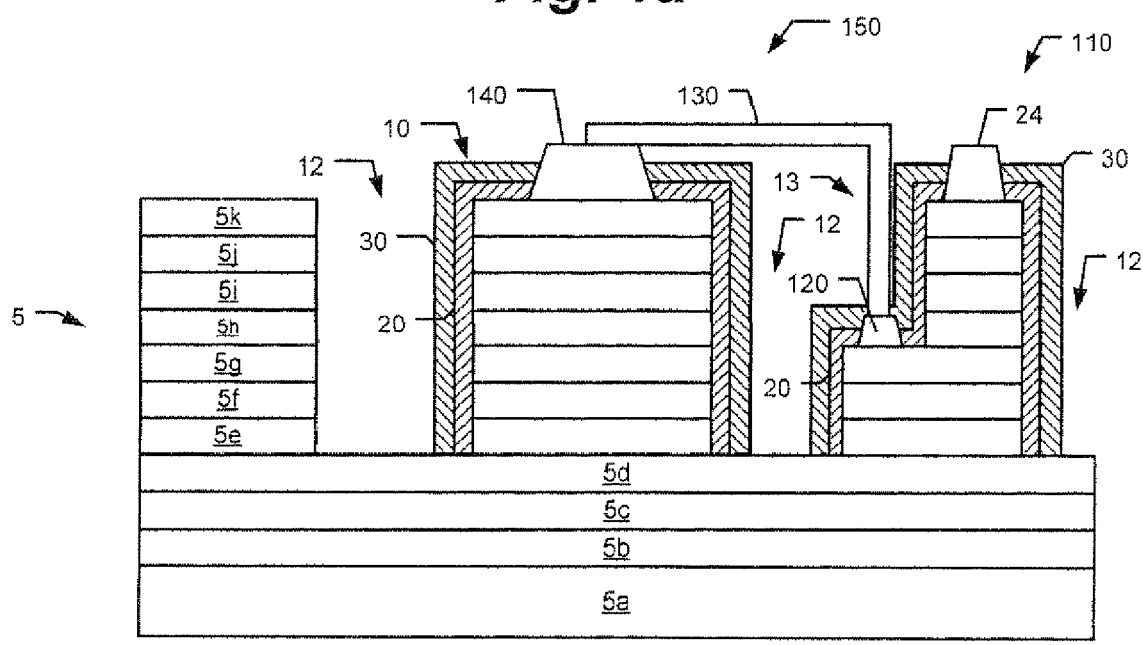
FIG. 4a illustrates a monolithically integrated GaAs/InGaP-based hetero-junction phototransistor (HPT) and hetero-junction bipolar transistor (HBT) photo-Darlington pixel according to an embodiment of the present invention.

Referring now to FIG. 4a, in the monolithically integrated HPT-HBT photo-Darlington 150 thereof, high-k coating 20 is environmentally protected using material 30, akin to FIG. 2. Again, like references refer to like elements of the embodiments, and will not be discussed again.

Figure 3B:
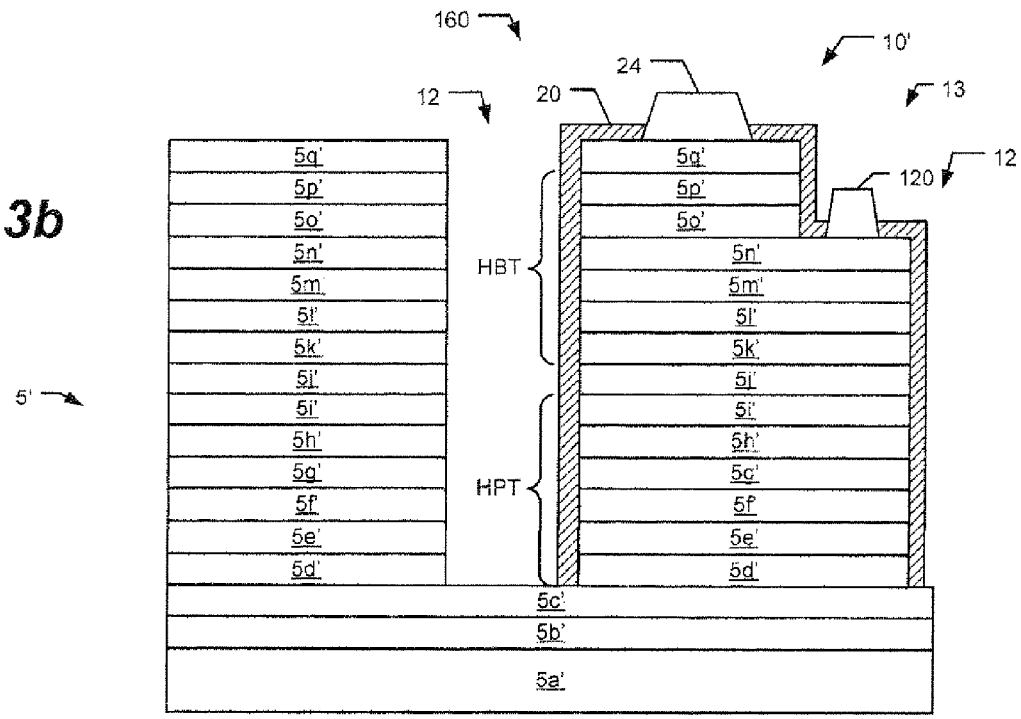
FIG. 3b illustrates a monolithically and vertically integrated hetero-junction phototransistor (HPT) and hetero-junction bipolar transistor (HBT) photo-cascode pixel according to an embodiment of the present invention.

Referring now to FIG. 3b, there is shown a monolithically and vertically integrated photo-cascode 160 utilizing an HPT/HBT mesa 10' defined by trench 12. "Photo-cascode", as used herein, generally refers to a light sensitive two-stage amplifier composed of a light sensitive HPT followed by an HBT current buffer. It should be appreciated that such a monolithic and vertical integration of an HPT and HBT device may be particularly suitable for providing densely packed light-sensitive pixel arrays, readily interfacing APS-CMOS readout circuitry.

The illustrated mesa HPT/HBT photocascode device 10' is formed from layered material system 5'. In the illustrated embodiment, and by way of non-limiting example only, material system 5' may take the form of a GaAs material-base system. In the illustrated embodiment, system 5' includes a GaAs substrate 5a. In the illustrated embodiment, system 5' includes a GaAs epitaxy buffer layer 5b disposed over substrate 5a'. In the illustrated embodiment, system 5' includes an InGaP etch stop layer 5c' disposed over buffer layer 5b'. In the illustrated embodiment, system 5 includes an InGaP emitter layer 5d' disposed over etch stop layer 5c'. In the illustrated embodiment, system 5' includes an InGaP layer 5e' serving as a high-bandgap portion of the emitter hetero-junction and deposited over layer 5d'. In the illustrated embodiment, system 5 includes a GaAs layer 5f' serving as a low-bandgap portion of the emitter hetero-junction and deposited over layer 5e'. In the illustrated embodiment, system 5, includes a GaAs base layer 5g' disposed over layer 5f'. In the illustrated embodiment, system 5' includes a GaAs absorber layer and collector junction 5h' disposed over layer 5g'. In the illustrated embodiment, system 5' includes an GaAs collector layer 5i' disposed over 5h'. In the illustrated embodiment, system 5' includes an HPT-HBT recombination layer 5j' disposed over layer 5i'. In the illustrated embodiment, system 5' includes an InGaP emitter layer 5k' disposed over layer 5j'. In the illustrated embodiment, system 5' includes an InGaP layer 5l' serving as a high-bandgap portion of the emitter hetero-junction and disposed over layer 5k'. In the illustrated embodiment, system 5' includes a GaAs layer 5m' serving as a low-bandgap portion of the emitter hetero-junction and disposed over layer 5*l'*. In the illustrated embodiment, system 5' includes a GaAs base layer 5*n'* disposed over layer 5*m'*. In the illustrated embodiment, system 5' includes a GaAs collector junction layer 5*o'* disposed over layer 5*n'*. In the illustrated embodiment, system 5' includes a GaAs collector layer 5*p'* disposed over layer 5*o'*. Finally, in the illustrated embodiment, system 5' includes a GaAs cap layer 5*q'* disposed over layer 5*o'*.

In the illustrated embodiment of FIG. 3*b*, layers 5*d'*-5*i'* form an HPT device separated by recombination layer 5*j'* from an HBT device formed by layers 5*k'*-5*p'*. In the illustrated embodiment of FIG. 3*b*, trench 12 extends around mesa device 10' and through cap layer 5*q'*, HBT layers 5*p'*-5*k'*, recombination layer 5*j'*, and HPT layers 5*i'*-5*d'* to define mesa device 10'. In the illustrated embodiment of FIG. 3*b*, trench 12 includes a shallower portion or recess 13. In the illustrated embodiment of FIG. 3*b*, recess 13 extends through cap layer 5*q'*, HBT collector layer 5*p'*, and HBT collector junction layer 5*o'* to expose a portion of GaAs HBT base layer 5*n'*. Contact 120 is provided on the recess 13 exposed portion of base layer 5*n'* to provide connectivity for the buried HBT structure. Contact 24 is provided on cap layer 5*q'*. In the illustrated embodiment of FIG. 3*b*, contact 120 may be used to provide an operating bias voltage for HPT/HBT photocascode device 10', and contact 24 may be electrically connected with readout circuitry to provide an indication of light impinging an HPT/HBT mesa photocascode device 10' corresponding portion (e.g., substantially vertically aligned portion) of substrate 5*a'*. Multiple such mesa HPT/HBT devices 10' may be defined by one or more trenches 12, to provide an array of sensors.

In the illustrated embodiment of FIG. 3*b*, mesa sidewall surfaces of HPT/HBT device 10' are exposed by trench 12. In the illustrated embodiment of FIG. 3*b*, the exposed mesa surface layers are passivated using an ALD formed high-k coating 20. In the illustrated embodiment of FIG. 3*b*, both the HPT and HBT have mesa sidewalls, or surfaces, passivated by Atomic Layer Deposition of $Al_xO_y$, (e.g., aluminum oxide, stoichiometric $Al_2O_3$ or non-stoichiometric $Al_xO_y$).

In the embodiment of FIG. 3*b*, p-n and p-i-n junctions can be either continuously graded or use abrupt junctions. Doped layers can be either uniform or non-uniform in their material composition, and the HPT-HBT recombination layer (e.g., 5*j'* in FIGS. 3*b*, 4*b*) may be used to prevent thyristor action. In certain embodiments of the present invention such a layer may include doped quantum well(s), mid-gap doped layer(s), simply thick doped layer(s), tunnel junction(s), or other structures useful for enhancing minority carrier recombination.

Figure 4B:
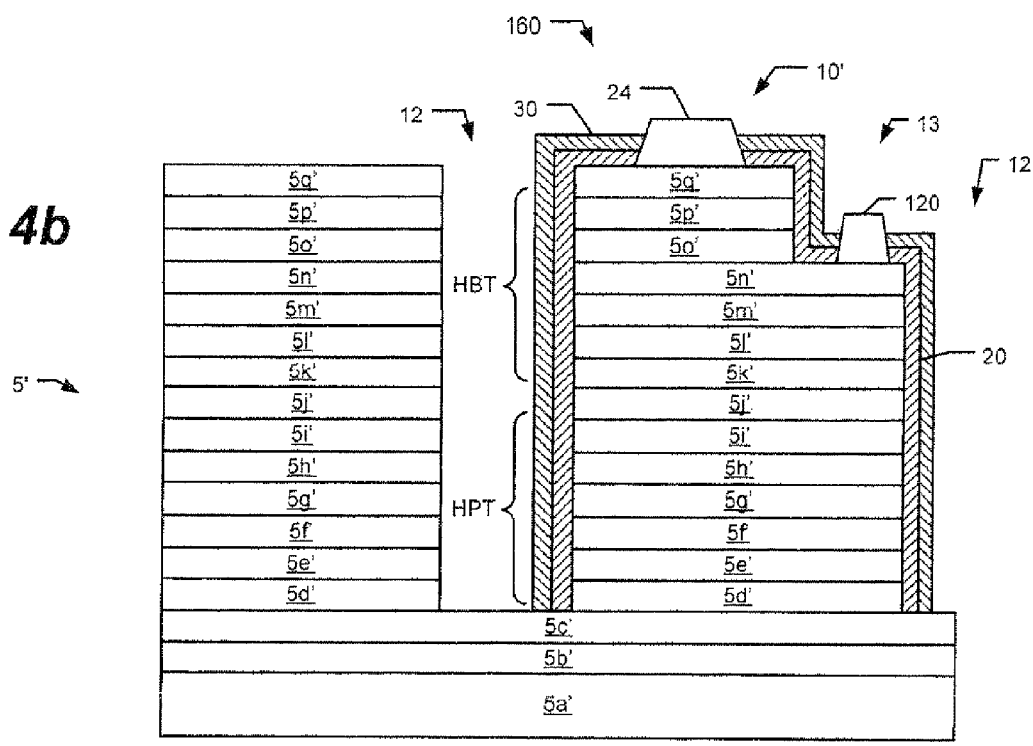
FIG. 4b illustrates a monolithically and vertically integrated hetero-junction phototransistor (HPT) and hetero-junction bipolar transistor (HBT) photo-cascode pixel according to an embodiment of the present invention.

Referring now to FIG. 4*b*, in the monolithically and vertically integrated HPT-HBT photo-cascode 160 thereof, the ALD formed high-k coating 20 is environmentally protected using material 30, akin to FIG. 4*a*. Again, like references in FIGS. 4*a* and 4*b* refer to like elements of the embodiments, and will not be again discussed.

For non-limiting purposes of further explanation, it should be appreciated that in the photo-Darlington of FIGS. 3*a*, 4*a*, the HPT photo-current is conducted into the base of the HBT, which further amplifies current signal. In contrast, in the photo cascode of FIGS. 3*b*, 4*b*, the HPT photo-current is conducted into the emitter of the HBT, which serves as the output buffer without amplifying the current signal. In certain embodiments of the present invention, the two structures may be combined to provide a Photo-Darlington cascode device with: (i) at least one HBT having a current input to its base to amplify the photo-current signal; and (ii) another HBT with current input to its emitter to buffer the current output to readout circuitry, such as a CMOS APS.

Figure 5:
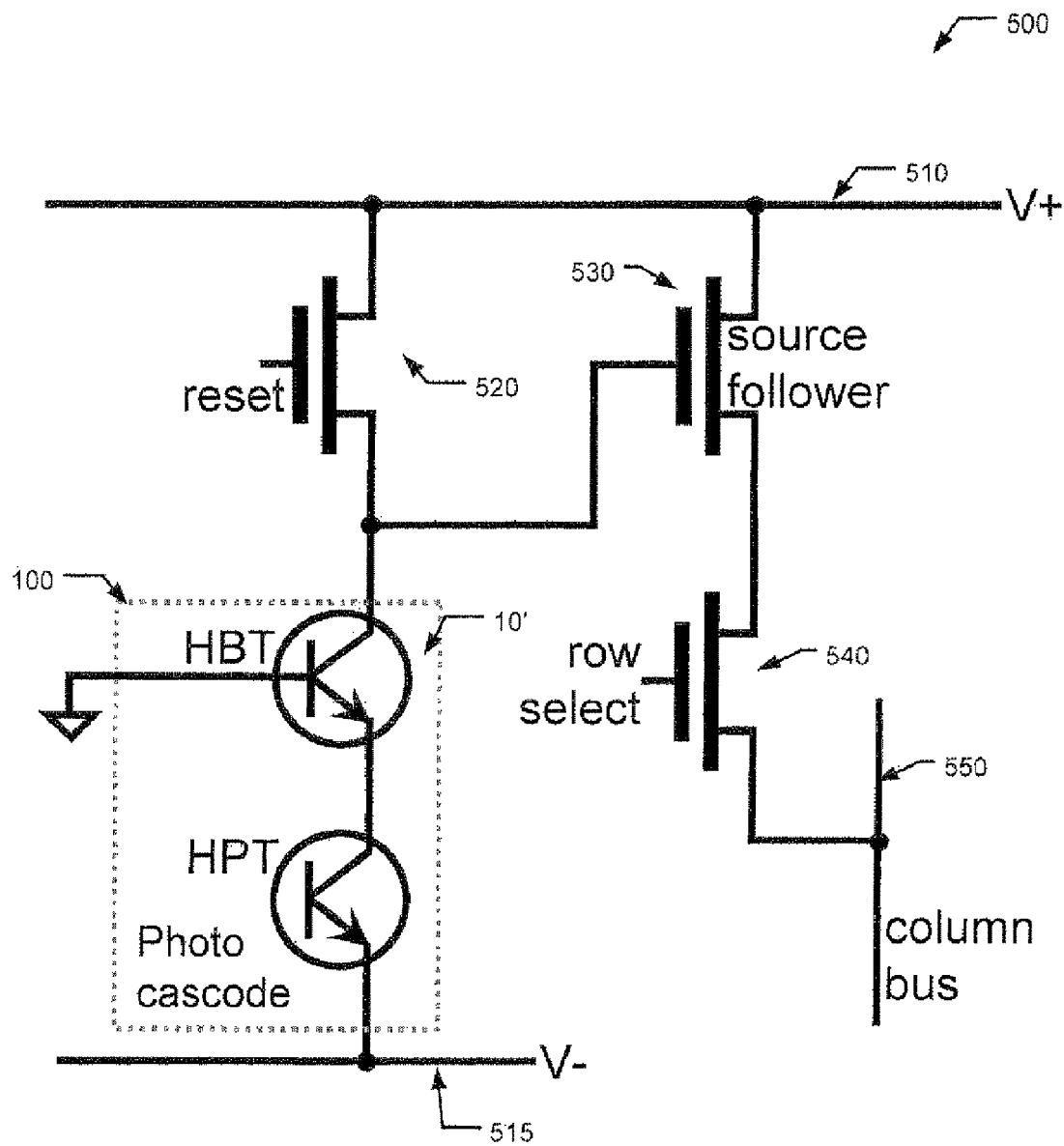
FIG. 5 illustrates a circuit diagram of an HPT-HBT photo-cascode used as the photo-detection element in a 3-transistor CMOS-APS (Complementary-Metal-Oxide-Semiconductor Active-Pixel-Sensor) imager pixel according to an embodiment of the present invention.

Referring now to FIG. 5, there is shown a schematic diagram of an APS (Active Pixel Sensor) CMOS pixel circuit utilizing the HPT-HBT photo-cascode of FIG. 3*b*. The APS CMOS is suitable for use as part of a PIN photodiode, for example. Compared to a single HPT, a monolithically and vertically integrated HPT-HBT photo-cascode according to certain embodiments of the present invention may have a higher output impedance, substantially eliminate the Miller effect, and exhibit higher gain or higher bandwidth. In certain embodiments of the present invention, in operation the HPT emitter junction is forward biased, while the HPT collector junction is reverse biased.

The schematic of FIG. 5 includes voltage supply 510, 515, in addition to a grounded HBT base, providing for three voltage references. A reset transistor 520 is coupled in series with photocascode 100 across voltage supply 510, 515. A control gate of a source follower transistor 530 is coupled to a junction between reset transistor 520 and photo-cascode 100. The source follower transistor and a row select transistor 540, having an addressable row select gate input, are coupled in series between voltage supply 510 and an addressable column bus 550.

The illustrated vertically and monolithically integrated HPT-HBT photo-cascode of FIG. 3*b* is a highly efficient way to interface the CMOS APS readout circuitry as shown in FIG. 5. Fabrication may be achieved analogously as that of the HPT, except for the Ohmic metal contact to the HBT base, which may be tied or connected together for all the pixels and grounded.

Figure 6:
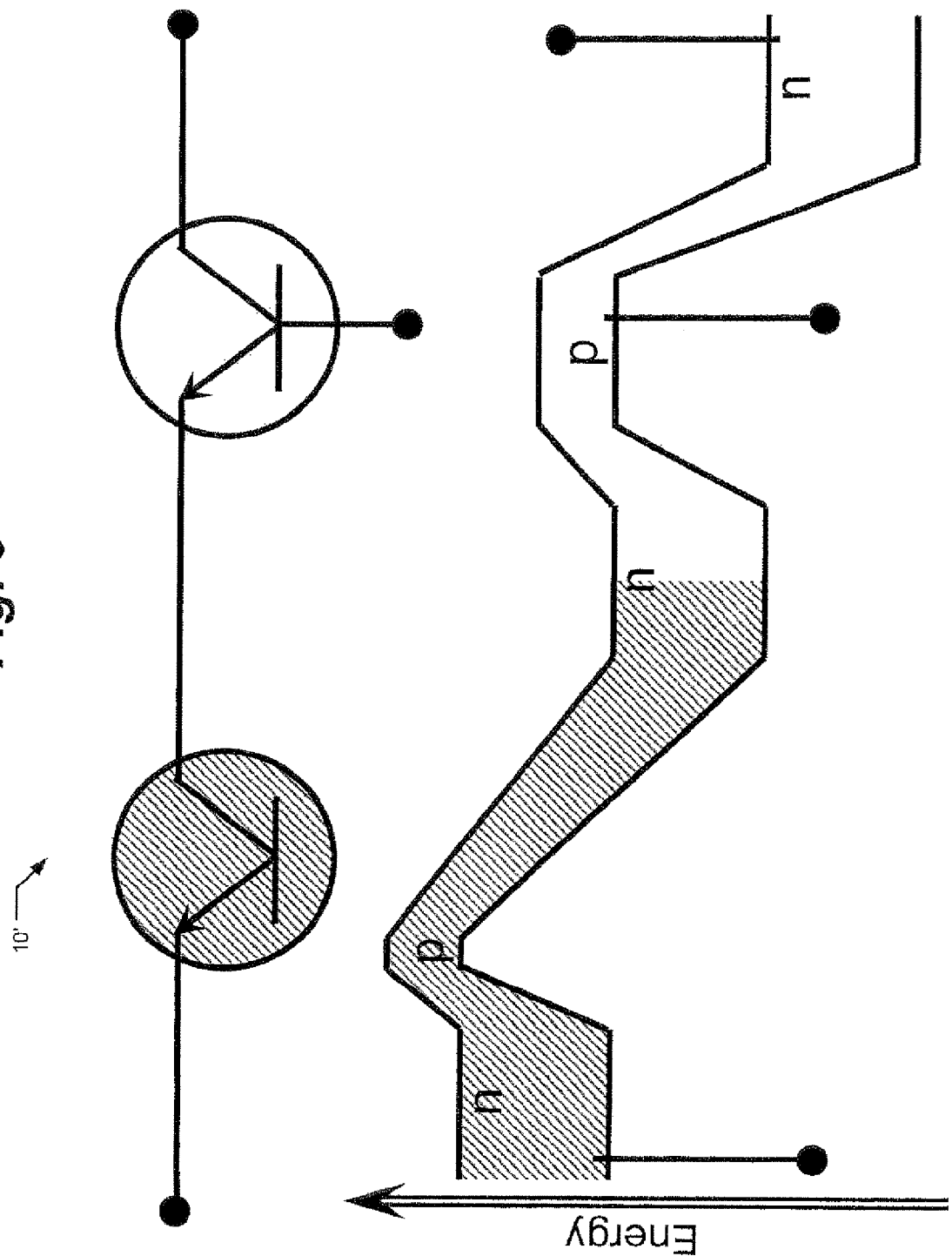
FIG. 6 illustrates equivalent circuit and energy band diagrams of a monolithically and vertically integrated HPT-HBT photo-cascode, according to an embodiment of the present invention.

Referring now to FIG. 6, there is shown an energy diagram of the photo-cascode of FIG. 3*b*. Again, p-n junctions in the monolithically and vertically integrated HPT photo-cascode can be either abrupt junctions, or graded junctions, or a combination of both. The doped layers can also be either one uniform layer of doped semiconductor, or multiple doped layers, such as doped quantum wells and barriers. An HPT-HBT recombination layer (such as that shown in FIGS. 3*b*, 4*b*) may be particularly useful in between the HPT and the HBT in the monolithically and vertically integrated photo-cascode to suppress thyristor action. In certain embodiments of the present invention such a layer may include doped quantum well(s), mid-gap doped layer(s), simply thick doped layer(s), tunnel junction(s), or other structures useful for enhancing minority carrier recombination. In certain embodiments of the present invention, in operation the HPT emitter junction is forward biased, while the HPT collector junction is reverse biased.

Referring still to FIG. 5 in certain embodiments of the present invention, it may be advantageous to have the entire circuit, including the HPT, the HBT and the MOSFETs, monolithically integrated on the same silicon substrate utilizing conventional BiCMOS design principles commonly associated with Si—Ge foundries. When silicon cannot be used to detect the radiation, it may be advantageous to fabricate the HPT on a different substrate, for example, InP, GaAs, GaN, or SiGeC, all by way of non-limiting example. Referring to FIGS. 3*b*, 4*b* and 5, it may be desirable to use the monolithically and vertically integrated photo-cascode flip-chip bonded to an APS-CMOS readout circuit, as is shown in FIG. 5 according to FIG. 8.

Figure 8:
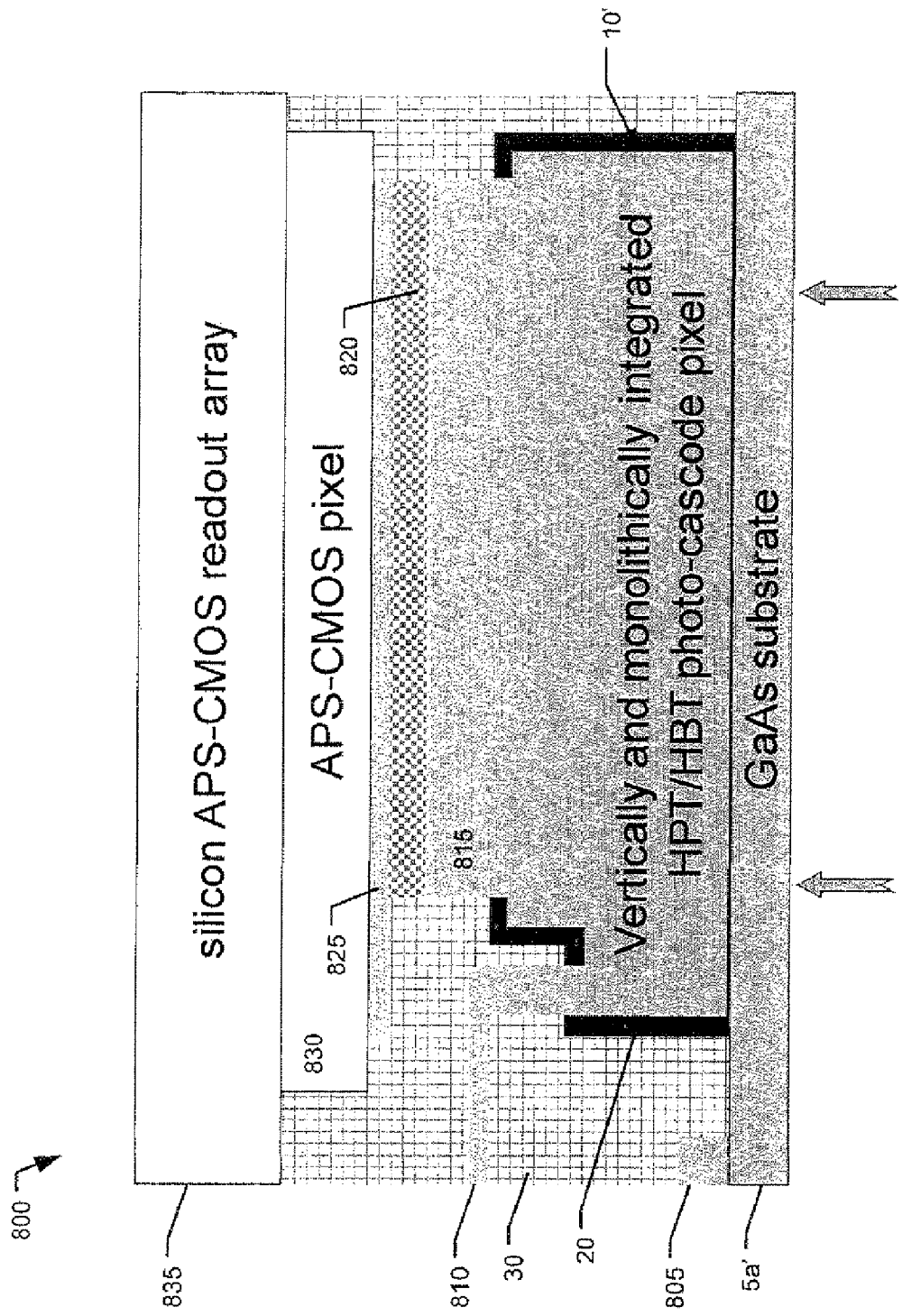
FIG. 8 illustrates a monolithically and vertically integrated HPT/HBT photo-cascode flip-chip bonded to an APS-CMOS readout circuit according to an embodiment of the present invention.

Referring still to FIG. 8, there is shown a photocascode 10' formed on a substrate 5'. An ALD formed $Al_2O_3$ mesa surface passivation coating 20 is provided. A dielectric 30 is provided. An interconnect metal 805 to provide for a common substrate bias is provided. An interconnect metal 810 to provide for a common HBT base bias is provided. An Ohmic metal contact 815 is provided for photo-cascode. An indium bump 820 is provided. An Ohmic metal contact 825 is provided for LED. An APS-CMOS pixel 830 is provided. Finally, a silicon APS-CMOS readout array 835 is provided. Low level input light may be provided at substrate 5a'.

Figure 9:
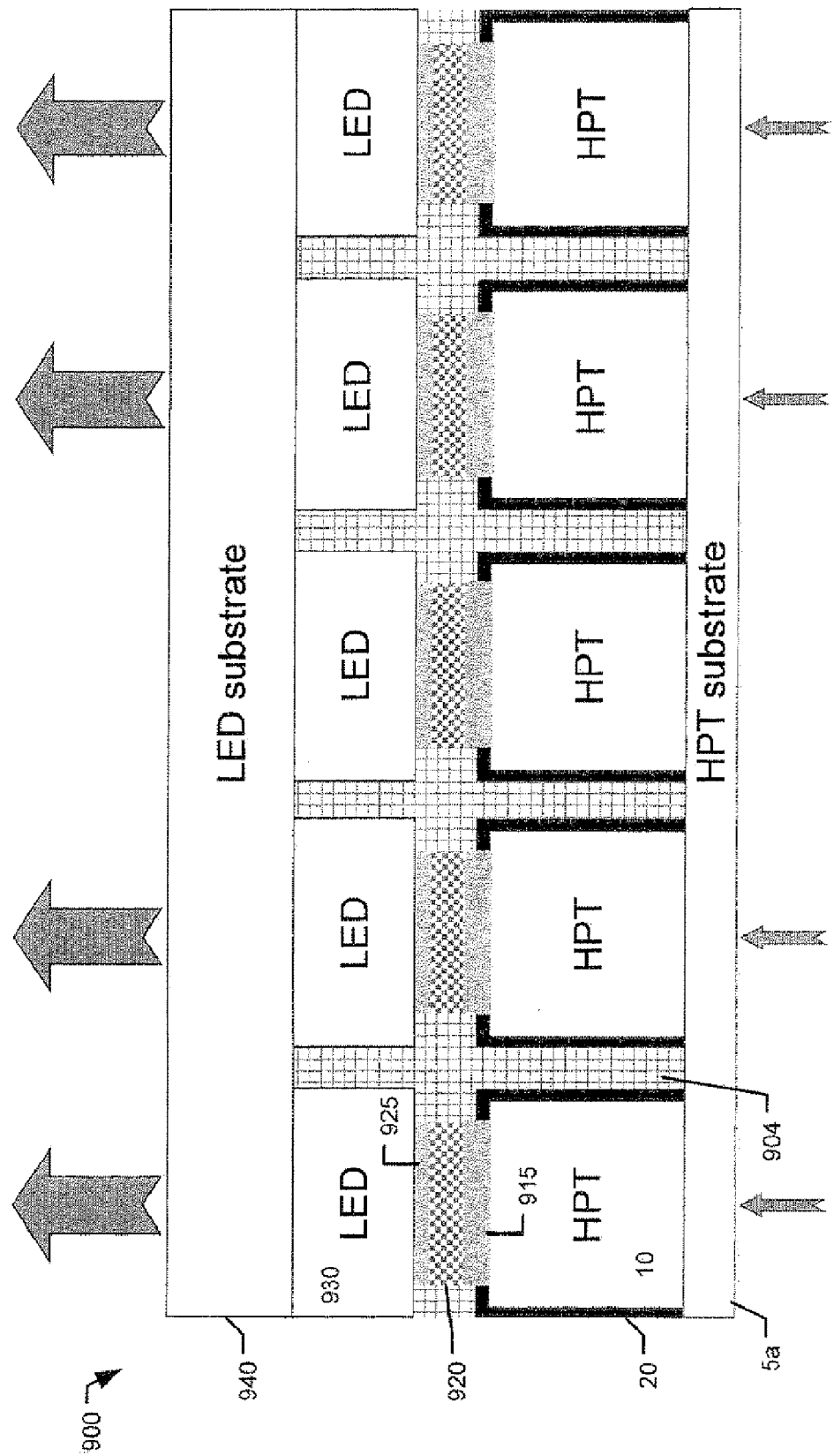
FIG. 9 illustrates a semiconductor image intensifier using a single HPT in each pixel according to an embodiment of the present invention.

Referring now to FIG. 9, there is shown a semiconductor image intensifier with a single-HPT pixel array. In aforementioned U.S. Pat. No. 7,067,853 by the same inventor, a semiconductor image intensifier is disclosed comprising an HPT-based photodetector array flip-chip bonded to an LED array. Experimental results for the HPT pixel without using ALD formed $Al_2O_3$ mesa surface passivation demonstrated a gain >100, which is >10 times higher sensitivity than avalanche photodiodes operated in the non-Geiger mode. Experimental results for the HPT pixel using ALD formed $Al_2O_3$ mesa surface passivation demonstrate a gain >1,000, which is >100 times higher sensitivity than avalanche photodiodes operated in the non-Geiger mode, Dark current and dark current noises are also significantly suppressed in the ALD formed $Al_2O_3$ passivated HPTs. This optimization may result in an image intensifier with improved sensitivity, lower dark current and lower dark current noises. Hence we disclose the design of the semiconductor image intensifier in FIG. 9 may be particularly useful.

Referring still to FIG. 9, there is shown a semiconductor image intensifier 900 using a single HPT. Image intensifier 900 includes a plurality of HPTs 10 formed on a substrate 5a. An ALD formed $Al_2O_3$ mesa surface passivation coating 20 is provided. A light absorbing dielectric 904 is provided. A plurality of Ohmic metal contacts 915 are provided on HPT. A plurality of indium bumps 920 are provided. A plurality of Ohmic metal contact 925 are provided. A plurality of LED devices 930 are provided on LED. An LED substrate 940 is provided. Low level input light may be provided at substrate 5a. An amplified light output from LEDs 930 may be provided responsively to the input light at substrate 5a.

It should be appreciated that a floating-base HPT serves as a single-stage amplifier with two output electrodes. A photo-Darlington consisting of one floating-base HPT and one HBT serves as a two-stage amplifier also with two output electrodes. Therefore, a photo-Darlington can be utilized as a substitute for an HPT in certain embodiments of the present invention. Further, one floating-base HPT and two HBTs, for example, can be cascaded into the 3-stage photo-Darlington, as shown in FIG. 10, to achieve higher gain, and hence, higher sensitivity for the detector and the image intensifier.

Figure 10:
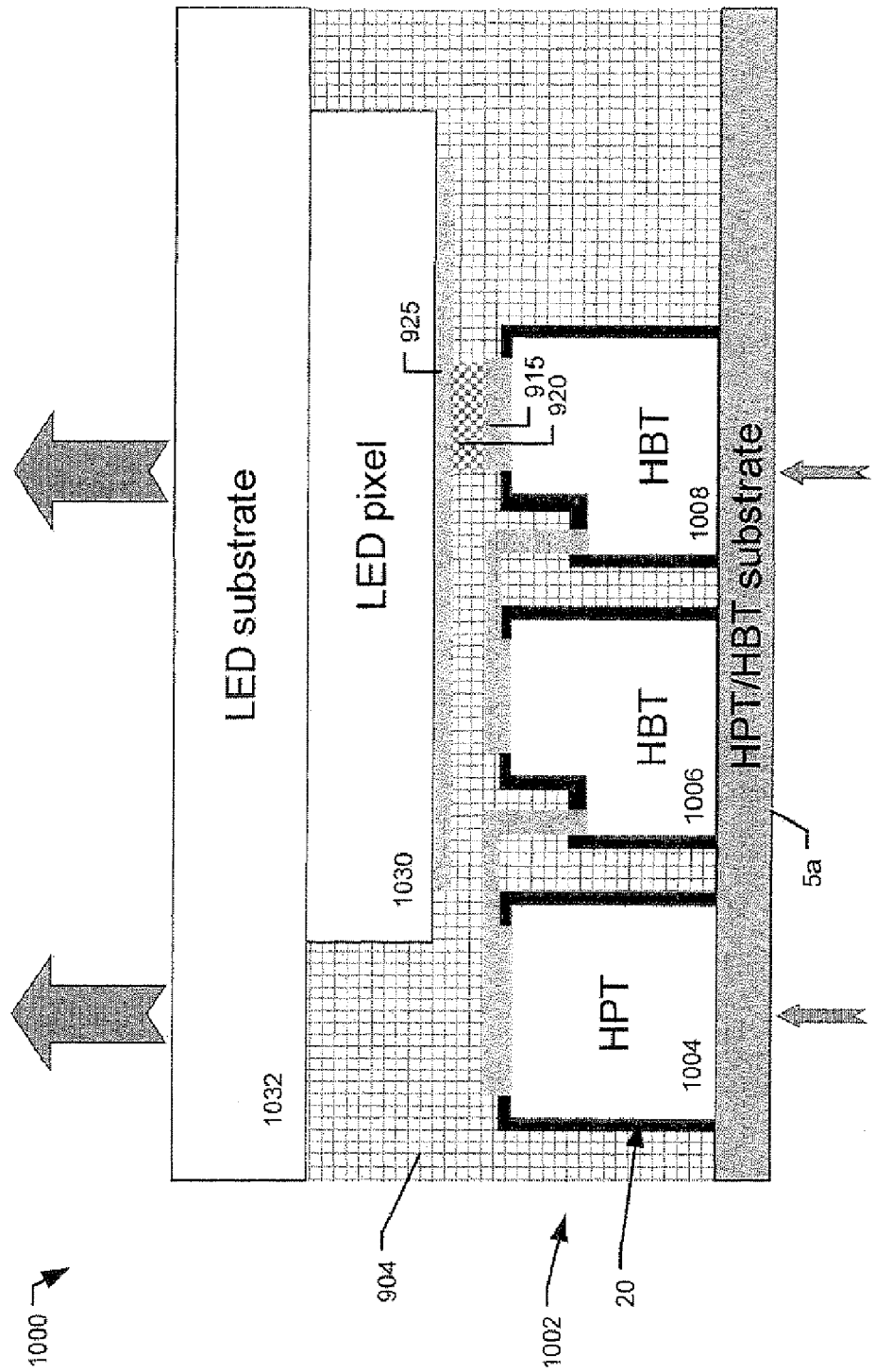
FIG. 10 illustrates a semiconductor image intensifier pixel using a multi-stage photo-Darlington according to an embodiment of the present invention.

FIG. 10 shows one pixel of a semiconductor image intensifier 1000 consisting of one LED 1030 on an LED substrate 1032, flip-chip bonded to one 3-stage photo-Darlington 1002. In certain embodiments of the present invention, HPT 1004 and HBT's 1006, 1008 formed on a substrate 5 in the photo-Darlington have their mesa sidewall surfaces passivated by ALD formed $Al_2O_3$ 20, again improving gain and to reducing dark current and dark current noises, which is critically important to prevent HBT gain saturation by dark current. In both FIGS. 9 and 10, a light-absorbing polymer 904 may be used to prevent positive optical feedback from LED into the HPT and suppresses self-sustained saturation and on-off switching. Again, low level input light may be provided at substrate 5a. An amplified light output from LED 1030 may be provided responsively to the input light at substrate 5a.

Figure 7:
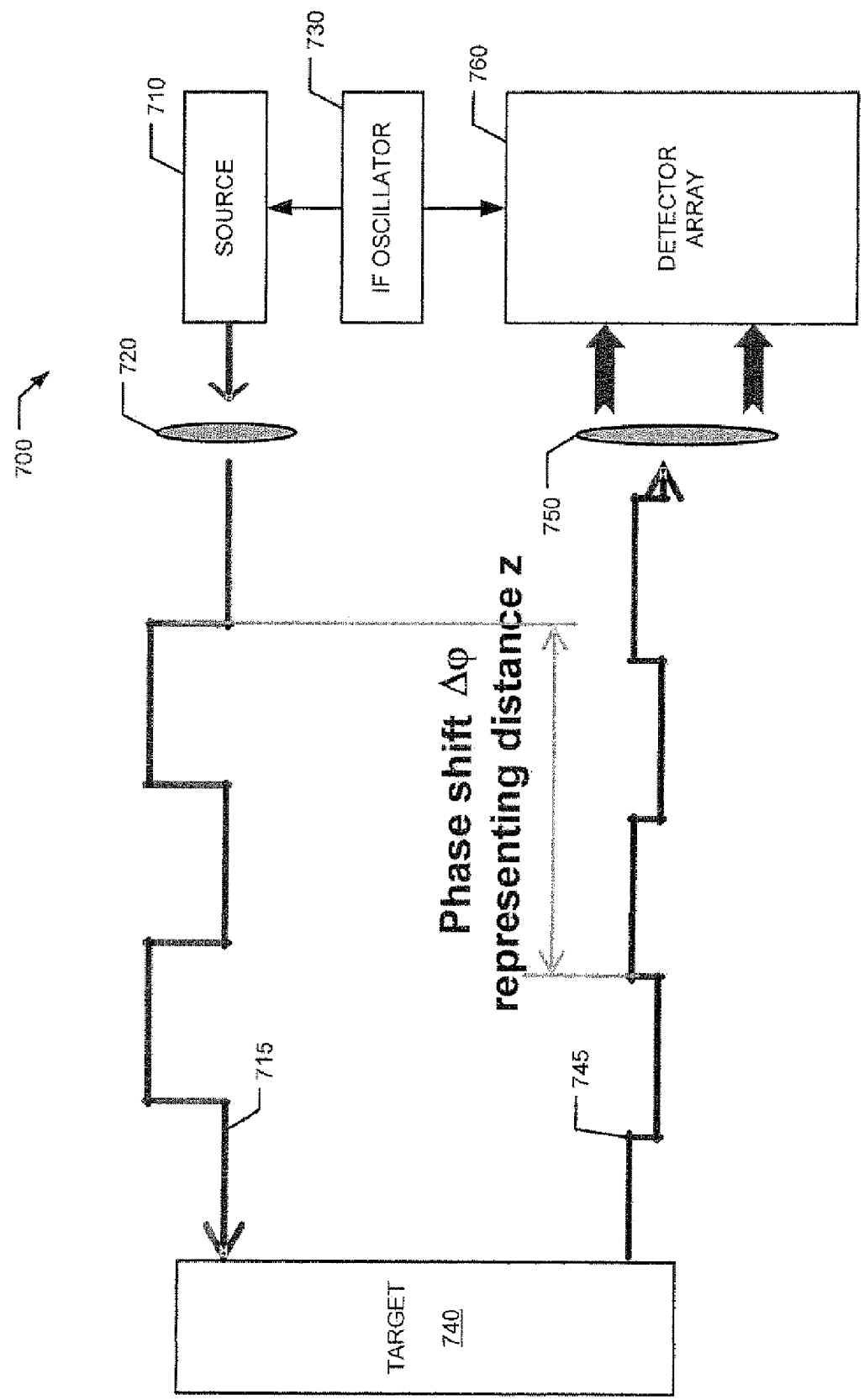
FIG. 7 illustrates a system architecture of a digitally modulated homodyne flash LIDAR using an HPT-based photodetector array or semiconductor image intensifier, whose HPT or photo-Darlington gain may be modulated by the modulation of HPT or photo-Darlington bias voltage at substantially the same frequency as the modulation frequency of the light source, providing "homodyning", according to an embodiment of the present invention.

Referring now to FIG. 7, there is shown a digitally modulated homodyne flash LIDAR system 700 according to an embodiment of the present invention. System 700 generally includes a light source 710 having lensing 720 optically coupled thereto. "Lensing", as used herein, generally refers to one or more optical lenses, mirrors, filters, beam steering apparatus and/or other optical components useful for projecting and/or collecting optical signals. System 700 additionally includes an intermediate frequency (IF) oscillator 730 electrically coupled to and driving light source 710. Light source 710 may emit emissions 715 via lensing 720 towards a target 740 responsively to oscillator 730. In other words, source light emissions 715 are modulated at an intermediate frequency (IF), and projected onto target 740 at a distance z, via lensing 720. At least some of emissions 715 are reflected by target 740 as reflections 745.

Referring still to FIG. 7, system 700 additionally includes lensing 750 optically coupled to an HPT-based photodetector array 760. In certain embodiments of the present invention, array 760 may take the form of a two dimensional array of HPT, photo-Darlington or HPT-HBT photo-cascode detector pixels, coupled to APS CMOS read-out circuitry, in accordance with the depictions in and discussion regarding FIGS. 1-6 and 8-10. In certain embodiments of the present invention, reflections 745 may be collected by lensing 750, and focused onto the HPT-based photo-detector array 760, which may serve as a semiconductor image intensifier array.

In the illustrated embodiment, array 760 is also coupled to and operates responsively to and dependently upon IF (intermediate frequency) oscillator 730. The relative phase of the IF modulation of reflections 745 carries information on target distance z. By measuring the phase modulation at a series of modulation frequencies IF, one can infer target distance z at each and every detector pixel of array 760.

More particularly, the distance to the target is encoded in the relative phase difference between the transmitted and reflected optical signals 715, 745. In order to analyze this phase difference and obtain distance z information, a high-speed analog mixer complete with a low-pass filter for homodyning the received optical signal and the electrical IF signal modulating the transmitted beam 715 may be used.

In certain embodiments of the present invention, homodyne IF-mixing and low-pass-filtering may be directly achieved by directly modulating the bias voltage, and hence, HPT or photo-Darlington gain, of photodetector array 760 at the same frequency as light source 710. "Homodyning", as used herein, generally refers to a method for detecting frequency modulated electromagnetic radiation by non-linearly mixing received signals with a reference frequency. The pixel gain of HPT or photo-Darlington is modulated at IF frequencies, whether an electronic readout circuit, such as the CMOS-APS, reads out the detector array, or the image intensifier configuration is employed with LED array optical output. Both light source 710 and array 760 may obtain their IF modulation clock signal from the same oscillator 730, to provide synchronization there-between. HPT photo detection quantum efficiency is nominally maximized and not modulated at all—contrary to the teachings of U.S. Pat. Nos. 6,515,740 and 6,580,496 and WO 02/049339A3. In certain embodiments of the present invention, multiple homodyne measurements may be performed. In certain embodiments of the present invention, two homodyne measurements may be made at two mutually orthogonal phases at each IF frequency.

It may also be appreciated the charge integration readout circuitry is an excellent low pass filter with cutoff frequency of about 1 kHz, or less. As will be appreciated by those possessing an ordinary skill in the art, 1 kHz generally corresponds to the highest frame-rate of large format, commercially available APS CMOS imagers. By way of non-limiting example, a large format refers to greater than 100,000 pixels. By way of a further non-limiting example, a large format refers to greater than one mega-pixel. When optically coupled to the output of an image intensifier, an APS-CMOS imager may serve as the electronic readout for the optical output of the image intensifier, and may provide the same low-pass filtering necessary for homodyne flash LIDAR operation.

Further, during flash LIDAR operation, where IF is set to a series of different values ranging from the highest non-ambiguous frequency at the low end to the lowest frequency to resolve the required distance resolution in z at the high end, one may detect the relative phase difference by integrating over multiple cycles, detecting the relative phase, and deducing range z at each pixel in the image.

In certain embodiments of the present invention, there may be provided a semiconductor hetero-junction phototransistor (HPT) device with a floating base, an emitter, a collector, emitter junction and collector junction, wherein at least the emitter junction, the floating base and the collector junction of the HPT are opto-electrically active. The device may have at least one mesa structure with a mesa size of about 1 centimeter (1 cm) or less. The sidewall surfaces of the mesa may intersect the opto-electrically active semiconductor layers. The mesa sidewall surfaces of the electro-optically active semiconductor layers may be nominally completely passivated via Atomic Layer Deposition (ALD) of an inorganic electrical insulator. The insulator may be in direct physical contact with the mesa sidewall surface of the semiconductor device active layers. The ALD-insulator may contain oxygen (e.g., of about 10% atomic count or more). The ALD passivating insulator may be covered with another dielectric material.

In certain embodiments of the present invention, each functioning pixel of a multi-pixel array may include at least one such HPT.

In certain embodiments of the present invention, a semiconductor image intensifier, which includes a plurality of pixels, may be provided. Each of the functioning pixels may include at least one such HPT. Each functioning pixel may additionally include at least one hetero-junction bipolar transistor (HBT), wherein at least the emitter junction, the base and the collector junction are electrically active, wherein the sidewall surfaces of said HBT intersect said electrically active semiconductor layers, wherein said HBT sidewall surfaces of the electrically active semiconductor layers are nominally completely passivated by the Atomic Layer Deposition (ALD) of an inorganic electrical insulator except for the electrical contact to the HBT base, wherein said insulator is in direct physical contact with said mesa sidewall surface of said semiconductor device active layers except for the electrical contact to the HBT base, wherein said ALD-insulator contains oxygen (>=10% atomic count), and wherein said ALD passivating insulator is further covered with other materials.

In certain embodiments of the present invention, each pairing of such an HPT and HBT may form a corresponding photo-Darlington. In certain embodiments of the present invention, each pairing of such an HPT and HBT may form a corresponding photo-cascode. In certain embodiments of the present invention, such a photo-cascode may be a monolithically and vertically integrated photo-cascode device, and have an epitaxial structure. Such a monolithically and vertically integrated photo-cascode device may have an HPT base that is floating.

In certain embodiments of the present invention, the Atomic Layer Deposition (ALD) passivation insulator may be predominantly aluminum oxide (either stoichiometric $Al_2O_3$ or non-stoichiometric $Al_xO_y$) with a total combined atomic count of Al and O about 95% or more. In certain embodiments of the present invention, the thickness of the ALD-deposited passivation layer may be around 2,000 Angstroms, or less. In certain embodiments of the present invention, the ALD-deposited passivation layer may primarily consist of $ZrSiO_xN_y$ (zirconium silicon oxynitride) or $HfSiO_xN_y$ (hafnium silicon oxynitride).

In certain embodiments of the present invention, such an HPT device may include or consist of InP, InAs, InGaAs, InAlAs, InGaAsP, InAlAsP, InAlGaAs and their alloys with suitable dopants. In certain embodiments of the present invention, such an HPT device may include or consist of GaAs, InAs, AlAs, InGaAs, AlGaAs, InGaP, InAlGaAs, InGaAsP, InAlGaAsP and their alloys with suitable dopants. In certain embodiments of the present invention, such an HPT may include or consist of GaN, AlGaN, InGaN, InN, AlN and their alloys with suitable dopants. In certain embodiments of the present invention, such an HPT may include or consist of Si, SiGe, SiGeC and their alloys with suitable dopants.

In certain embodiments of the present invention, the HPT and the HBT can be independently either n-p-n or p-n-p types.

In certain embodiments of the present invention, a flash LIDAR (light detection and ranging) instrument may be provided that includes or consists of: at least one modulated light source, and at least one HPT-based photodetector array or semiconductor image intensifier. The HPT or photo-Darlington gain of the HPT-based photodetector array or semiconductor image intensifier may be modulated via the HPT or photo-Darlington bias voltage modulated at nominally the same frequency as the modulating frequency of the light source.

In certain embodiments of the present invention, there are proposed a design, method of fabrication and system application of mesa hetero-junction phototransistor (HPT) arrays, HPT-based photodetector arrays and semiconductor image intensifiers whose HPT mesa sidewall surfaces are passivated by Atomic Layer Deposition (ALD) of $ZrSiO_xN_y$ (zirconium silicon oxynitride, or $HfSiO_xN_y$ (hafnium silicon oxynitride), or $Al_2O_3$ (aluminum oxide). A monolithically and vertically integrated photo-cascode facilitates CMOS APS readout. Also provided is a homodyne flash lidar (light detection and ranging) instrument.

Figure 12:
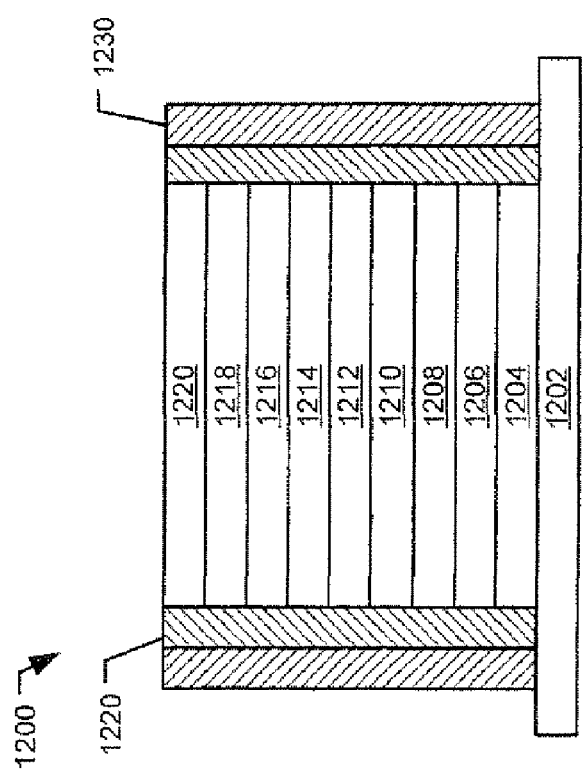
FIG. 12 illustrates a semiconductor opto-electronic mesa device with opto-electronically active p-n junctions exposed at a mesa sidewall and being passivated according to an embodiment of the present invention.
Figure 11:
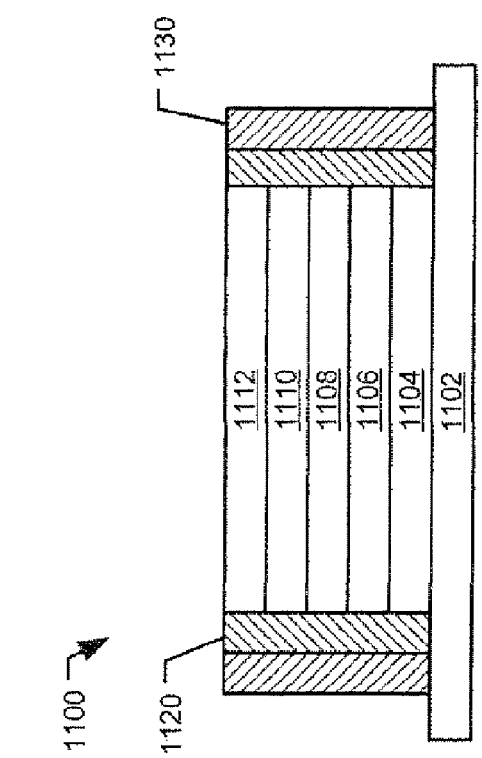
FIG. 11 illustrates a semiconductor opto-electronic mesa device with opto-electronically active p-n junction exposed at a mesa sidewall and being passivated according to an embodiment of the present invention.

Referring now to FIGS. 11 and 12, there are shown semiconductor opto-electronic mesa devices 1100, 1200 whose opto-electronically active p-n junction (FIG. 11) or junctions (FIG. 12) exposed at mesa sidewall are passivated by ALD formed $Al_2O_3$ coating 1120, 1220. Commonly practiced structures, such as Ohmic metal contacts, cleaving or scribing streets, are not shown.

In semiconductor opto-electronics devices with forward-biased p-n junctions, such as the buried hetero-junction laser taught in U.S. Pat. No. 5,851,849, entitled PROCESS FOR PASSIVATING SEMICONDUCTOR LASER STRUCTURES WITH SEVERE STEPS IN SURFACE TOPOGRAPHY, the entire disclosure of which is hereby incorporated by reference as if being set forth in its entirety herein, whose lasing quantum wells reside inside the p-n junction, surface recombination current is detrimental to laser threshold and quantum efficiency. Hence, commercial laser products typically include an active laser p-n junction buried in semiconductor materials. This greatly complicates design and fabrication, and compromises manufacturing yield and uniformity.

In semiconductor opto-electronic devices with reverse-biased p-n junctions, such as the p-i-n photodiode, where the junction comprises the photo-absorption layer, and the avalanche photodiode, where the junction comprises the photo-absorption, grading, field-control and multiplication layers, surface leakage dark current leads to dark current noises and low avalanche gain. Hence, commercial photo-detector products are typically formed using a dopant diffusion process to form the active p-i-n junction. This results in stringent manufacturing tolerances, device non-uniformity and large planar device sizes not suitable for monolithic integration.

FIGS. 11 and 12 show a simplified mesa sidewall surface passivation that works well for both forward-biased and reverse-biased junctions. Device design and fabrication are greatly simplified according to FIGS. 11 and 12, since one only needs to etch trenches to define the mesa device and perform ALD of high-k dielectric materials. A second more environmentally stable dielectric 1130, 1230 may advantageously be used to cover and further protect the ALD high-k layer.

Referring now FIG. 11, by way of non-limiting further explanation, device 1100 may include a GaAs substrate 1102. GaAs/InGaAP layers 1104 may be formed on substrate 1102. N-doped un-depleted InGaP layer 1106 may be formed on layers 1104, A depleted p-n or p-i-n opto-electronically active junction 1108 may be formed over layer 1106. A p-doped un-depleted GaAs layer 1110 may be formed on layer 1108. And, GaAs/InGaP layers 1112 may be formed over layer 1110.

Referring now to FIG. 12, by way of further non-limiting explanation, device 1200 may include a GaAs substrate 1202. GaAs/InGaAP layers 1204 may be formed on substrate 1202. N-doped un-depleted InGaP layer 1206 may be formed on layers 1204. A depleted p-n or p-i-n opto-electronically active junction 1208 may be formed over layer 1206. A p-doped un-depleted GaAs layer 1210 may be formed on layer 1208. GaAs/InGaP layers 1212 may be formed over layer 1210. A p-doped un-depleted GaAs layer 1214 may be formed over layer 1212. A depleted p-n or p-i-n opto-electronically active junction 1216 may be formed over 1214. An n-doped un-depleted GaAs layer 1218 may be formed over layer 1216, And, GaAs/InGaP layers 1220 may be formed over layer 1218. Two junctions, at layers 1216 and 1208 are included.

Those of ordinary skill in the art may recognize that many modifications and variations of the present invention may be implemented without departing from the spirit or scope of the invention. Thus, it is intended that the present invention covers the modifications and variations of this invention provided they come within the scope of the appended claims and their equivalents.

What is claimed is:

1. A method of fabricating an opto-electronic device comprising:
   exposing active layers of at least one p-n or p-i-n junction as part of a mesa device at surrounding side-walls of the mesa device; and
   depositing by Atomic Layer Deposition (ALD) at least one high-k dielectric material adjacent to and passivating at least the side-wall exposed active layers.

2. The method of claim 1, wherein said device further comprising:
   a plurality of p-n or p-i-n junctions as part of a common mesa having active layers exposed at side-walls of the mesa device; and
   the at least one atomic layer deposited high-k dielectric material adjacent to and passivating at least the side-wall exposed active layers.

3. The method of claim 2, wherein the multiple junctions of said device are in a common semiconductor material system.

4. A method of fabricating a sensor comprising an array of light sensitive pixels, wherein each pixel comprises at least one hetero-junction phototransistor having a floating base without base contact metal, comprising at least the following two steps:
   first, exposing active layers of each mesa phototransistor at phototransistor mesa side-walls; and
   second, depositing by Atomic Layer Deposition (ALD) at least one high-k dielectric material adjacent to and passivating at least the side-wall exposed active layers.

5. The method of claim 4, wherein each pixel of said sensor comprises a plurality of active p-n or p-i-n junctions, and is operated with one junction forward biased and another junction reverse biased.

6. The method of claim 4, wherein each pixel of said sensor further comprises a second dielectric material deposited over and environmentally protecting the high-k dielectric material.

7. The method of claim 6, wherein the second dielectric of said sensor forms a substantially planarizing layer.

8. The method of claim 6, wherein the second dielectric of said sensor forms a substantially mesa conforming layer.

9. The method of claim 4, wherein each pixel of said sensor further comprises at least one hetero-junction bipolar transistor being electrically coupled to the at least one phototransistor.

10. The method of claim 9, wherein each pixel hetero-junction phototransistor of said sensor is monolithically integrated with the pixel hetero-junction bipolar transistor.

11. The method of claim 10, wherein each hetero-junction bipolar transistor of said sensor is a mesa device having active layers exposed at side-walls of the mesa device; and
   the at least one atomic layer deposited high-k dielectric material is adjacent to and passivating at least the side-wall exposed active layers of the hetero-junction phototransistor and hetero-junction bipolar transistor.

12. The method of claim 11, wherein each pixel hetero-junction phototransistor of said sensor is vertically integrated with the pixel hetero-junction bipolar transistor and thus forming a photo-cascode.

13. The method of claim 12, wherein said sensor further comprising an APS-CMOS readout circuit flip chip bonded to the photocascodes.

14. The method of claim 11, wherein each pixel hetero-junction phototransistor of said sensor has an emitter contact coupled to the hetero-junction bipolar transistor base contact, thereby forming a photo-Darlington.

15. The method of claim 11, wherein the phototransistor and bipolar transistor of said sensor are electrically coupled to form a photo-cascode.

16. The method of claim 9 wherein the at least one phototransistor and at least one bipolar transistor of said sensor share a common epitaxial structure.

17. The method of claim 9, wherein said sensor further comprising:
   a light emitting diode electrically coupled to a hetero-junction bipolar transistor.

18. The method of claim 4, wherein the high-k dielectric of said sensor comprises aluminum oxide.

19. The method of claim 4, wherein said sensor further comprising an electronic readout circuit electrically coupled to each of the sensor pixels.

20. The method of claim 4, wherein said sensor further comprising a light emitting diode electrically coupled to the phototransistor.

21. The method of claim 4, wherein said sensor further comprising:
   an oscillator electrically coupled to the pixels; and
   a light source electrically coupled to the oscillator and reflectively illuminating the pixels responsively to the oscillator;
   wherein, excitation of the pixels by the oscillator directly homodynes received reflected transmissions with oscillator modulation of the light source and a gain of the pixels is modulated by the oscillator.

22. A method of fabricating an opto-electronic device comprising:
- exposing active layers of at least one p-n or p-i-n junction as part of a mesa device at surrounding side-walls of the mesa device; and
- depositing by Atomic Layer Deposition (ALD) at least one high-k dielectric material in direct physical contact with and passivating at least the side-wall exposed active layers.

23. A method of fabricating a sensor comprising an array of light sensitive pixels, wherein each pixel comprises:
- at least one hetero-junction phototransistor having a floating base without base contact metal, comprising at least the following two steps:
- first, exposing active layers of each mesa phototransistor at phototransistor mesa side-walls; and
- second, depositing by Atomic Layer Deposition (ALD) at least one high-k dielectric material in direct physical contact with and passivating at least the side-wall exposed active layers.

* * * * *